United States Patent [19]

Kodama

[11] Patent Number: 5,716,891
[45] Date of Patent: Feb. 10, 1998

[54] FABRICATION PROCESS OF SEMICONDUCTOR DEVICE

[75] Inventor: Noriyuki Kodama, Tokyo, Japan

[73] Assignee: NEC Corporation, Tokyo, Japan

[21] Appl. No.: 693,562

[22] Filed: Aug. 7, 1996

Related U.S. Application Data

[63] Continuation of Ser. No. 497,718, Jun. 30, 1995, abandoned.

[30] Foreign Application Priority Data

Jun. 30, 1994 [JP] Japan ................................. 6-170472

[51] Int. Cl.⁶ .................................................. H01L 21/31
[52] U.S. Cl. ........................ 438/783; 438/784; 438/787; 438/790; 438/795
[58] Field of Search ................................. 437/238, 240, 437/241, 247, 978

[56] References Cited

U.S. PATENT DOCUMENTS

| | | | |
|---|---|---|---|
| 5,045,504 | 9/1991 | Gualandris et al. | 437/235 |
| 5,094,984 | 3/1992 | Liu et al. | 437/238 |
| 5,104,482 | 4/1992 | Monkowski et al. | 437/238 |
| 5,139,971 | 8/1992 | Giridhar et al. | 437/247 |
| 5,273,936 | 12/1993 | Ikeda | 437/238 |
| 5,409,858 | 4/1995 | Thakur et al. | 148/DIG. 133 |

FOREIGN PATENT DOCUMENTS 5-63100  3/1993  Japan.

*Primary Examiner*—Trung Dang
*Attorney, Agent, or Firm*—Sughrue, Mion, Zinn, Macpeak & Seas, PLLC

[57] ABSTRACT

With forming an element isolation oxide layer on p-well in a thickness of 3500 Å, n-type MOS transistor with a gate electrode and source and drain regions are fabricated. Thereafter, an oxide layer is deposited by an atmospheric pressure chemical vapor deposition. Subsequently, with taking TEOS as material, a TEOS-BPSG layer is deposited by way of a reduced pressure chemical vapor deposition. Then, under inert atmosphere, heat treatment is performed at a temperature higher than or equal to 700° C. to remove organic component in the layer. Thereafter, reflow process is performed at a temperature of approximately 900° C. under nitrogen atmosphere at normal pressure. By this, the organic component in the BPSG layer formed utilizing TEOS can be removed out of the layer to improve element isolation characteristics and reduce leak current.

14 Claims, 3 Drawing Sheets

FABRICATION PROCESS OF SEMICONDUCTOR DEVICE

This is a Continuation of application Ser. No. 08/497,718 filed Jun. 30, 1995 now abandoned.

BACKGROUND OF THE INVENTION

1. Field of the Invention

The present invention relates generally to a fabrication process of a semiconductor device. More specifically, the invention relates to a semiconductor device fabrication process which includes a process step for forming a silicon oxide layer with taking an organic type gas as a material.

2. Description of the Related Art

In the recent years, package density of semiconductor integrated circuit device is progressively increasing. Also, higher level functions have been required for such semiconductor integrated circuit device. Therefore, refining and multileveling of the semiconductor device become necessary. Therefore, unevenness on the surface of the substrate becomes substantial. As a result, in order to improve coverage of metal wiring on the semiconductor substrate, importance for planarization technology is progressively increasing.

Under such circumstance, TEOS-BPSG (boron-phosphorous-silicate glass) film or TEOS-NSG (nondoped silicate glass) film with taking TEOS (tetraethylorthosilicate) as a material has been attracting attention as an interlayer insulation layer of the semiconductor device for superior coverage ability and flatness after reflow.

FIGS. 1A to 1C are sections of various process steps for explaining the fabrication process of the semiconductor device having TEOS-BPSG film as the interlayer insulation layer.

Initially, ion implantation of boron and phosphorous for a p-type silicon substrate is performed. Then, by providing heat treatment, a region called as well is formed. In FIG. 1A, p-well 21 is illustrated. Thereafter, overall surface of the substrate is oxidized in a thickness of several hundreds Å. Subsequently, nitride layer is deposited over the entire surface. Then, the nitride layer is removed with leaving the same in a region where elements should be formed. By ion implantation, a channel stop 22 is formed. Thereafter, oxidation is performed over the entire surface except for the portion where the nitride layer is maintained to form an element isolating oxide layer 23. Then, the nitride layer and the oxide layer on the element forming region are removed. Then, ion implantation is performed to a channel region for controlling the threshold voltage and a gate oxide layer 24 is formed by thermal oxidation. Subsequently, by depositing a polycrystalline silicon layer in a thickness of approximately 4000 Å. After lowering of resistance of the layer by diffusion of phosphorous, a gate electrode 25 is formed by patterning the polycrystalline silicon layer.

After formation of the gate electrode, oxidation is again performed in a thickness of around a hundred Å. for screen oxide. Thereafter, by ion implantation of n-type impurity, such as phosphorous or so forth, a low concentration impurity diffusion layer 26 called as LDD (lightly doped drain) is formed.

Subsequently, a side wall 27 is formed by deposition of an oxide layer and etching back of the deposited oxide layer. Thereafter, source and drain regions 28 are formed by ion implantation of n-type impurity, such as arsenic or so forth.

Subsequently, by way of an atmospheric pressure CVD method (APCVD method), an oxide layer 29 is deposited in a thickness of approximately 1000 Å. Then, with taking TEOS as a material, a low pressure CVD method (LPCVD method) at a temperature of approximately 600° C., TEOS-BPSG layer 30 is deposited in the thickness of approximately 3000 Å [FIG. 1A]. Thereafter, for planalization, heat treatment (annealing) is performed at approximately 900° C. under ambient pressure in nitrogen atmosphere to cause reflow of the BPSG layer 30 to flatten the surface thereof [FIG. 1B].

While not illustrated, a contact hole is formed through the TEOS-BPSG layer 30 and the oxide layer 29. Then, Al electrode is formed through the contact hole. Thereafter, heat treatment at approximately 400° C. under hydrogen atmosphere (so-called hydrogen alloying treatment) is performed to lower the contact resistance of the Al electrode.

On the other hand, after planarization process of the TEOS-BPSG layer 30, it is possible that polycrystalline silicon layer, silicon nitride layer or so forth is formed on the BSPG layer 30. Such layer is illustrated as a cover layer 31 in FIG. 1C.

The foregoings are the basic MOS-type transistor fabrication process. While a significant step may not be caused in the semiconductor device, in which only MOS-type transistor is formed. However, in the practical device, the semiconductor device typically has three-dimensional and complicated structure. For instance, in case of DRAM, polycrystalline silicon layers are stacked in two or three layer structure for formation of a capacitive electrode and so forth. For this reason, the TEOS-BPSG layer formed through LPCVD method having superior flatness becomes useful as the interlayer insulation layer.

On the other hand, in the case where it is not desirable to expose high temperature atmosphere for the reason that already established characteristics of the semiconductor is not destroyed, low temperature layer formation method, such as plasma method and so forth is employed as a layer formation technology in forming the oxide layer with taking organic material. In case of the plasma method, since the layer formation temperature is low in the extent lower than or equal to 150° C., carbon or organic component may reside in the formed oxide layer to cause lowering of reliability of the device.

As a solution for such problems, Japanese Unexamined Patent Publication (Kokai) No. Heisei 5-68100 proposes a method for forming a silicon oxide layer by plasma method with taking TEOS as a material and then oxidizing residual organic component. Residual organic component is removed by effecting heat treatment at a temperature lower than or equal to 450° C. in the atmosphere of nitrogen gas containing less than or equal to 20% of oxygen gas, under pressure from the normal pressure to 1 mTorr.

However, the semiconductor device having TEOS-BPSG layer has lower characteristics than the semiconductor device having oxide layer (including BPSG layer) formed of silane type material. Namely, for the n-type transistor in the condition shown in FIG. 1B, the semiconductor device with the TEOS-BPSG layer caused degradation of the transistor characteristics, such as lowering of element isolation characteristics. In the condition of FIG. 1B, degradation of the characteristics of the semiconductor device is not substantial. However, lowering of element isolation characteristics is significantly lowered when the cover layer, such as nitride layer is formed and heat treatment is performed on the BPSG layer as shown in FIG. 1C.

In case of the above-mentioned TEOS-BPSG layer, since the heat treatment temperature is high, i.e. approximately 900° C. for reflow, it has been considered that most of residual organic component diffused out of the BPSG layer during reflow process. However, from yield of product and from extensive analysis of transistor characteristics, it has been found that the residual organic compound serves as a cause of degradation of the transistor characteristics.

When impurity distribution in the element isolation region of the semiconductor device having the TEOS-BPSG layer was obtained by way of a secondary ion mass spectrometry method, carbon concentration in the BPSG layer was 1 to $2 \times 10^{19}$ atoms/cc and in the region of the oxide layer/silicon substrate interface, carbon concentration of $5 \times 10^{15}$ atoms/cm$^2$ is piled up in the peak concentration.

The cause of piling up is considered to be the phenomenon as shown in FIG. 1B.

During heat treatment in reflow process, the most part of the residual organic compound (considered to be carbon as a main component) is removed from the layer by out diffusion as illustrated by line a. While quite small amount, a part of the residual organic compound is diffused into the substrate side as illustrated by line b and is accumulated at the oxide layer/silicon substrate interface 32 of the element isolation region. It is considered that, since the surface of the substrate at the element isolation region is provided a tendency to be n-type, the organic layer formed by reaction of the organic compound and silicon substrate has a positive charge or the organic substance reacts with the silicon substrate to shift the p-type silicon substrate toward n-type.

On the other hand, a part of the organic compound reaches the element portion as shown by line c to lower the transistor characteristics.

In particular, in the process to perform heat treatment after deposition of the cover layer 31 of nitride layer, polycrystalline silicon and so forth, after reflow process, the residual organic substance which cannot be removed completely during reflow process, is blocked from out diffusion (line d) by the cover layer 31 and, thus diffusion (line e, f) to the lower layer becomes substantial [see FIG. 1C].

Under such lowered pressure, as a method for removing residual organic substance during layer formation performed at the layer formation temperature of approximately 600° C., the heat treatment at relatively low temperature lower than or equal to 450° C. as disclosed in Japanese Unexamined Patent Publication No. Heisei 5-63100 will not at all effective in removal of fine amount of residual component after fellow.

On the other hand, since BPSG layer has high hygroscopicity, when it is subjected to heat treatment under $O_2$ atmosphere after leaving in the ambient air, similar phenomenon to wet oxidation may be caused due to presence of large amount of water in the BPSG layer at the heat treatment temperature higher than or equal to 800° C. to cause anomalous oxidation in the substrate.

SUMMARY OF THE INVENTION

It is a first object of the present invention to out-diffuse residual organic substance in an oxide layer formed by a CVD method using organic type material, such as TEOS and so forth, reduce amount of the residual organic substance to be diffused and reach a substrate side as much as possible, and thus can improve an element isolation characteristics.

A second object of the invention is to prevent anormalous oxidation during heat treatment.

In order to accomplish the above-mentioned objects, there is provided a fabrication process of a semiconductor device comprising the steps of:

forming an interlayer insulation layer primarily of silicon oxide by way of a low pressure chemical vapor deposition method with taking an organic type gas as a source gas; and performing a heat treatment at a temperature higher than or equal to 700° C. under the atmosphere of reduced pressure.

Preferable, the heat treatment step is performed at a temperature lower than or equal to 750° C. under oxidizing atmosphere with a mixture gas of oxygen and inert gas or nitrogen gas.

Since the fabrication process of the semiconductor device according to the present invention performs heat treatment before reflow process or reflow process itself of the interlayer insulation layer fabricated with taking TEOS as a source gas at a temperature higher than or equal to 700° C. under reduced pressure, out diffusion of residual organic compound in the layer residing after interlayer insulation layer formation process is promoted. Thus, a carbon content at the interface between the oxide layer and the silicon substrate can be reduced. Thus, the present invention can improve an element isolation characteristics and reduce leakage current to improve reliability of the product.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENTS

Figure 2A:
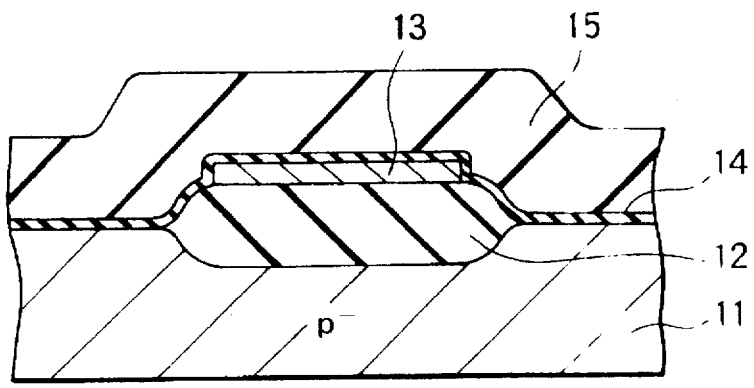
FIGS. 2A to 2C are sections of semiconductor device for explaining the effect of the present invention.
Figure 2B:
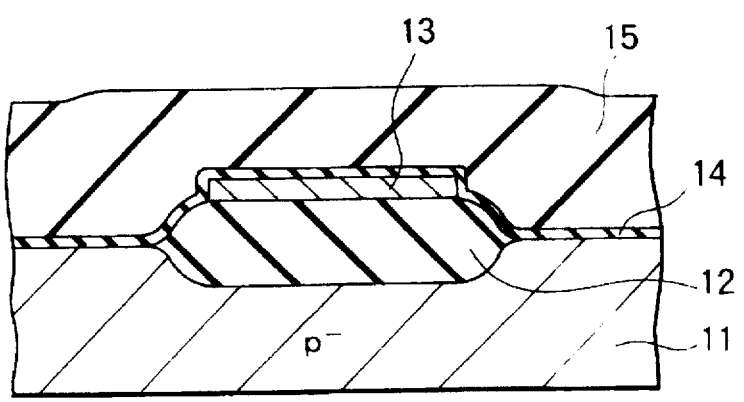
Figure 2C:
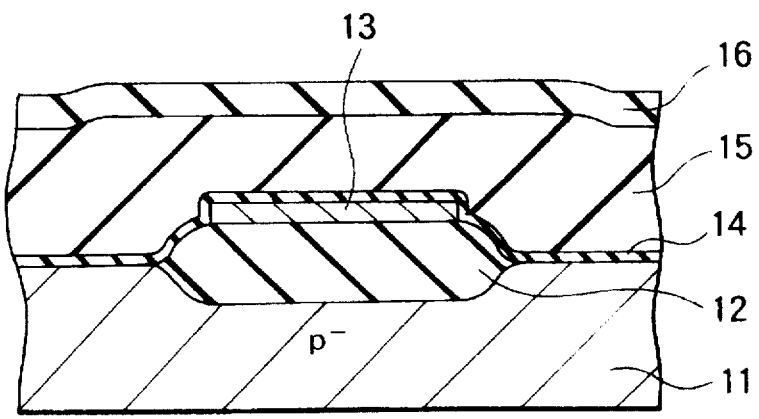

The preferred embodiment of the present invention will be discussed hereinafter in detail with reference to the accompanying drawings. FIGS. 2A to 2C are sections showing the preferred process of the present invention, in order of the process steps. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

As shown in FIG. 2A, on a p$^-$-type silicon substrate 11 having a specific resistance of 15 Ω-cm, an element isolation oxide layer 12 was formed in a thickness of 3500 Å by a selective oxidation method. On the element isolation oxide layer 12, an Al electrode 13 was formed for measurement of characteristics of the device.

On the Al electrode 13, a silicon oxide layer 14 in a thickness of 3000 Å was formed by APCVD method with taking silane as source gas. Also, by LPCVD method at a growth temperature of approximately 600° C., a TEOS-BPSG layer 15 in a thickness of 4000 Å was formed.

Subsequently, as shown in FIG. 2B, under hydrogen atmosphere of 10 mTorr, heat treatment was performed for 30 minutes. The temperature of heat treatment was varied in a range of 600° C. to 900° C. Thereafter, for reflow of the TEOS-BPSG layer, under nitrogen atmosphere at ambient pressure, heat treatment was performed for 30 minutes at a temperature of 900° C. (the product fabricated through this process will be referred to as "product of process A").

On the other hand, as shown in FIG. 2C, in order to investigate influence of application of a cover layer, another product was prepared by applying a silicon nitride layer 16 in a thickness of 100 Å after heat treatment for external diffusion of the organic component and the heat treatment for causing reflow of the TEOS-BPSG layer in similar manner to the product of the process A. This product was fabricated by growing the silicon nitride layer under nitrogen atmosphere of the normal pressure at a growth temperature of approximately 700° C. Subsequently, under nitrogen atmosphere of the normal pressure at a temperature of 900° C., heat treatment was performed for 30 minutes (the product fabricated through this process will be referred to as "product of process B").

For the purpose of comparison, a further product was fabricated by depositing BPSG layer by APCVD method and performing heat treatment for causing reflow. The configuration of this product is the same as that of FIG. 2B. This product will be hereinafter referred to as "product of process C".

At the fabrication completed condition of the products of respective processes, n-type impurity is diffused in the surfaces of the silicon substrates beneath the element isolation oxide layers 12. In order to demonstrate the effect of the present invention, capacities between the Al electrode 13 and the silicon substrate were measured with applying a negative voltage to the Al electrode 13 to derive a flat-band voltages. Lower flat-band voltage represents greater amount of positive charge at silicon oxide/silicon interface to have lower element isolation characteristics. The result of measurement is shown in FIG. 3.

Figure 3:
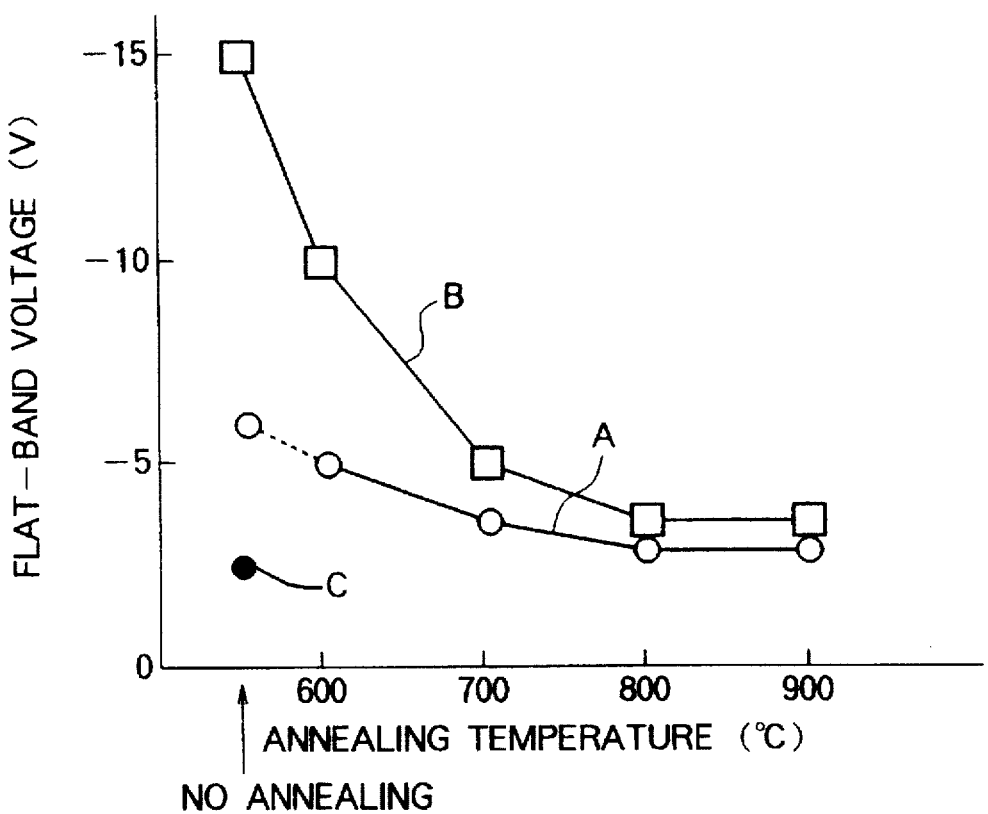
FIG. 3 is a graph showing a relationship between a heat treatment temperature and a flat band voltage for explaining the effect of the present invention.

In case of the product of the process C, as shown in FIG. 3, the flat-band voltage was −2.5 V. When heat treatment was not performed, the inverted voltage of the product of the process A was approximately −6 V. On the other hand, in case of the product of the process B, the element isolation characteristics was −15 V, which represents much lower element isolation Characteristics.

On the other hand, in both of the products of the processes A and B, the characteristics are dramatically improved when the heat treatment temperature exceeds about 700° C. When the heat treatment temperature exceeds 800° C., the flat-band voltages of the products of the processes A and B become −3.5 V which is comparable with that of the product of the process C.

The carbon distribution at the silicon interface beneath the element isolation oxide layer of the products of the processes A and B were obtained by way of the secondary ion mass spectrometry method. When heat treatment under reduced pressure is not performed, the carbon distribution in the product of the process A was $1 \times 10^{15}$ atoms/cm$^2$, and the carbon distribution in the product of the process B was $5 \times 10^{15}$ atoms/cm$^2$. In contrast to this, when the heat treatment temperature exceeds 700° C., the carbon distributions become $5 \times 10^{15}$ atoms/cm$^3$.

From the results set forth above, it should be appreciated that the present invention can reduce residual organic compound in the TEOS-BPSG layer, and prevent carbon at the interface between silicon oxide layer and silicon substrate from causing piling up and thus avoid degradation of the device characteristics by preventing degradation of the element isolation characteristics.

Next, discussion will be given for the results of evaluation of the characteristics, which evaluation has been performed by producing the semiconductor devices of the preferred embodiment of the semiconductor device.

[First Embodiment]

Figure 1A:
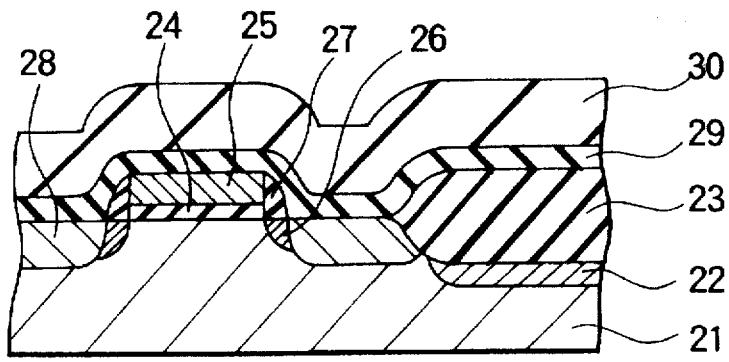
FIGS. 1A to 1C are sections for explaining typical fabrication process of MOS type semiconductor device.
Figure 1B:
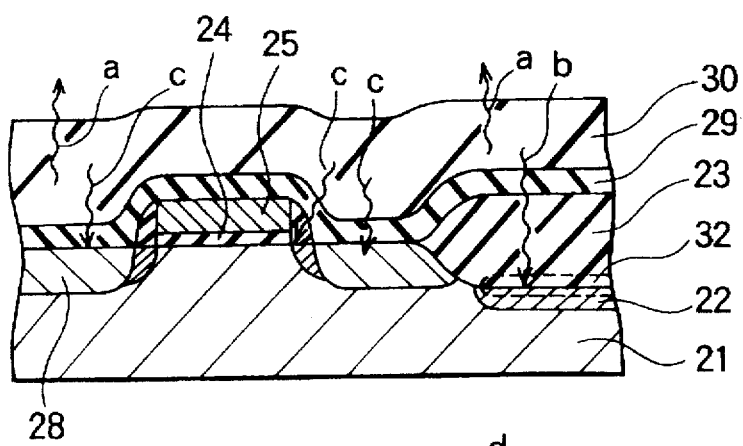
Figure 1C:
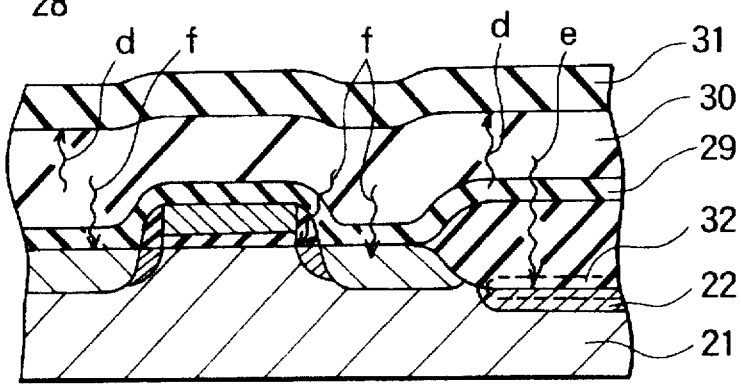

As shown in FIGS. 1A and 1B, the first embodiment of the semiconductor device was fabricated. Namely, on p-well 21, the element isolation oxide layer 23 in the thickness of 3500 Å was formed and then n-type MOS transistors having the gate electrode 25, the source and drain regions 28 were formed. Thereafter, by the atmospheric pressure chemical vapor deposition method, the oxide layer 29 was deposited in the thickness of approximately 1000 Å. Subsequently, with taking TEOS as source gas, TEOS-BPSG layer 30 was deposited in the thickness of approximately 3000 Å through reduced pressure chemical vapor deposition method at the growth temperature of approximately 600° C. [FIG. 1A].

Next, under hydrogen atmosphere of 10 mTorr, heat treatment was performed at 800° C. for 30 minutes. Thereafter, under nitrogen atmosphere of ambient pressure, heat treatment was performed at 900° C. to perform reflow process of the BPSG layer 30. [FIG. 1B]

Subsequently, through formation of the contact hole, formation of the Al wiring and hydrogen alloying process, fabrication of the shown embodiment of the semiconductor device was completed.

In the semiconductor device constructed as set forth above, substantially comparable characteristics to those of the semiconductor device having the BPSG layer formed with silane gas, in field inversion voltage, element isolation characteristics and leakage current characteristics.

In the heat treatment for out-diffusing residual organic compound, if degree of vacuum is equivalent to the degree of vacuum in the furnace in LPCVD or higher, sufficient effect can be obtained in removal of organic compound. This heat treatment may be performed in the growth furnace of the oxide layer (including the BPSG layer and so forth) subsequent to oxide layer formation process. In this case, it is sufficient to elevate the temperature in the furnace after formation of the oxide layer, to the desired temperature (e.g. 800° C.) and to supply appropriate gas. Also, it may be possible to newly set degree of vacuum upon heat treatment.

Gas to be used in heat treatment may be any gas having low reactivity, such as nitrogen, argon and so forth, in addition to hydrogen. Also, it is possible to elevate the heat treatment temperature of approximately 900° C. to perform reflow process of the layer at the same time.

[Second Embodiment]

Figure 4:
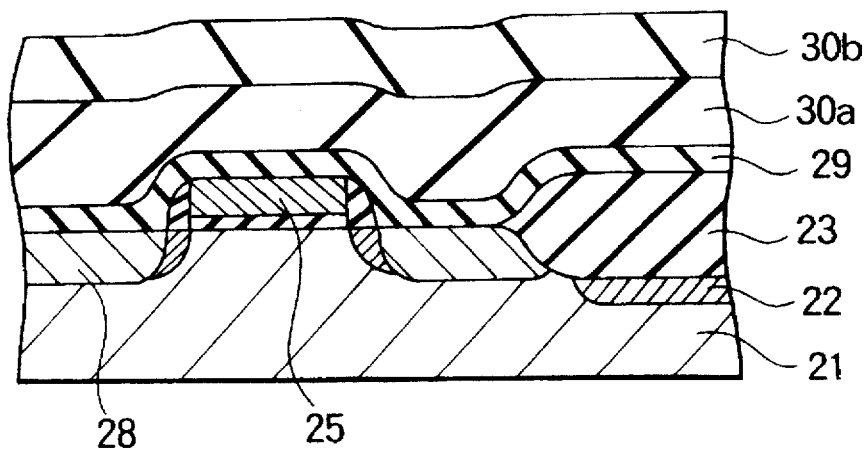
FIG. 4 is a section for explaining the second embodiment of the present invention.

Next, discussion will be given for the second embodiment of the present invention with reference to FIG. 4. Similarly to the first embodiment, MOS transistor is formed, and the oxide layer 29 is deposited in the thickness of approximately 1000 Å. Subsequently, the first TEOS-BPSG layer 30a in the thickness of 4000 Å is deposited at the temperature of 600° C. Thereafter, heat treatment is performed under nitrogen atmosphere under the pressure of 10 mTorr. Then, the furnace is cooled down to 600° C. to further deposit 4000 Å of the second TEOS-BPSG layer 30b. Thereafter, the temperature in the furnace is again elevated to perform heat treatment under the foregoing condition.

Subsequently, similarly process to the former embodiment, by forming the electrode and wiring, fabrication process of the shown embodiment is completed.

By the shown embodiment, when the TEOS-BPSG layer is thick, by performing deposition of the layer and heat treatment dividingly, removal of residual organic substance can be efficiently performed so that equivalent effect to the first embodiment can be obtained.

[Third Embodiment]

Next, discussion will be given for the third embodiment of the invention. As shown FIG. 1A, after formation of MOS transistor and 1000 Å of oxide layer 29 thereover, 4000 Å of TEOS-BPSG layer 30 was deposited up to 8000 Å. After removing from the furnace, it has been left in the atmosphere for 3 hours. Thereafter, by setting in the vacuum furnace, heat treatment was performed by elevating the temperature up to 750° C. under 10 mTorr of oxygen atmosphere for 20 minutes.

Since BPSG layer has high hygroscopicity, moisture content is increased when it is left in the atmosphere. However, in the shown embodiment, by performing heat treatment temperature at relatively low temperature of 750° C., anomalous oxidation of the foundation can be prevented even under oxidizing atmosphere.

Also, during the heat treatment in the shown embodiment, the oxygen in the atmosphere oxidize the residual organic compound to promote removal therefrom. Therefore, the comparable effect to the first embodiment can be attained at lower heat treatment temperature.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

For instance, while the shown embodiments has been discussed in terms of employment of BPSG layer, the present invention is equally applicable for other oxide layers, such as PSG layer or NSG layer. Also, while the MOS type semiconductor has been discussed as an example of the semiconductor device, the present invention is not specified in application to the specific device.

What is claimed is:

1. A fabrication process of a semiconductor device comprising the steps of:
    forming an insulation layer primarily of silicon oxide by way of low pressure chemical vapor deposition method using an organic type gas as a source gas; and
    performing a heat treatment at a temperature higher than or equal to 700° C. under pressure lower or equal to that of LPCVD pressure in an atmosphere devoid of deposition substance.

2. A fabrication process of a semiconductor device comprising:
    forming an element isolation oxide insulating layer in a region in a semiconductor substrate by way of selective oxidation method;
    forming a semiconductor element within an active region defined by said element isolation oxide insulating layer;
    forming a TEOS-BPSG insulation layer above said semiconductor element; and
    performing a heat treatment at a temperature higher than or equal to 700° C. under pressure lower or equal to that of conventional LPCVD pressure but in an atmosphere devoid of any deposition substance.

3. A fabrication process of a semiconductor device as set forth in claim 1 or 2, wherein said heat treatment is performed under degree of vacuum higher than or equal to that in formation of said insulation layer.

4. A fabrication process of a semiconductor device as set forth in claim 1 or 2, wherein said heat treatment is performed within a growth furnace forming said insulation layer, in subsequent process to formation of the insulation layer.

5. A fabrication process of a semiconductor device as set forth in claim 1 or 2, wherein the step of formation of said insulation layer and the step of heat treatment under atmosphere of reduced pressure are performed repeatedly for a plurality of times.

6. A fabrication process of a semiconductor device as set forth in claim 1 or 2, wherein the heat treatment is performed at a temperature lower than or equal to 750° C. under oxidizing gas atmosphere containing oxygen, and inert gas or nitrogen.

7. A fabrication process of a semiconductor device as set forth in claim 1 or 2, wherein the heat treatment is common for planarizing heat treatment for the insulation layer.

8. A method of fabricating an insulating layer on a semiconductor device comprising the steps of:
    depositing a TEOS-BPSG layer on said semiconductor device in a furnace using LPCVD; and
    performing heat treatment at a temperature in the range of 600° C.–900° C. and under hydrogen atmosphere at pressure lower or equal that of the LPCVD pressure.

9. The method of fabricating an insulating layer on a semiconductor device according to claim 8 further comprising the step of performing heat treatment at temperature in the range of 600° C.–900° C. and in nitrogen atmosphere at atmospheric pressure.

10. The method of fabricating an insulating layer on a semiconductor device according to claim 8 further comprising the steps of:
    depositing another second TEOS-BPSG layer in said furnace using LPCVD; and
    performing a second heat treatment at a temperature in the range of 600° C.–900° C. and under hydrogen atmosphere at pressure commensurable with that of the LPCVD pressure.

11. The method of fabricating an insulating layer on a semiconductor device according to claim 8, wherein said heat treatment is performed in said furnace.

12. The method of fabricating an insulating layer on a semiconductor device according to claim 10, wherein said second heat treatment is performed in said furnace.

13. A method of fabricating an insulating layer on a semiconductor device comprising the steps of:
    depositing a TEOS-BPSG layer on said semiconductor device in a furnace using LPCVD;
    removing said semiconductor device from said furnace and exposing said semiconductor device to the atmosphere; and
    performing heat treatment at a temperature in the range of 600° C.–900° C. and under oxygen atmosphere at pressure lower or equal that of the LPCVD pressure.

14. A method of fabricating an insulating layer on a semiconductor device comprising the steps of:
    depositing a TEOS-BPSG layer on said semiconductor device in a furnace using LPCVD; and
    performing heat treatment at a temperature in the range of 600° C.–900° C. and at pressure lower or equal to with that of the LPCVD pressure and using gas selected from nitrogen, hydrogen, argon and helium.

* * * * *